(12) United States Patent
Moore et al.

(10) Patent No.: US 6,882,578 B2
(45) Date of Patent: Apr. 19, 2005

(54) PCRAM REWRITE PREVENTION

(75) Inventors: John Moore, Boise, ID (US); R. Jacob Baker, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/680,161

(22) Filed: Oct. 8, 2003

(65) Prior Publication Data

US 2004/0071042 A1 Apr. 15, 2004

Related U.S. Application Data

(62) Division of application No. 10/035,197, filed on Jan. 4, 2002.

(51) Int. Cl.[7] .................................................. G11C 7/00
(52) U.S. Cl. ................... 365/189.01; 365/203; 365/207
(58) Field of Search ........................... 365/189.01, 203, 365/207

(56) References Cited

U.S. PATENT DOCUMENTS

| 3,271,591 A | 9/1966 | Ovshinsky |
| 3,622,319 A | 11/1971 | Sharp |
| 3,743,847 A | 7/1973 | Boland |

(Continued)

FOREIGN PATENT DOCUMENTS

| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

(Continued)

*Primary Examiner*—Son T. Dinh
(74) *Attorney, Agent, or Firm*—Dickstein Shapiro Morin & Oshinsky LLP

(57) ABSTRACT

A programmable conductor memory cell is read by a sense amplifier but without rewriting the contents of the memory cell. If the programmable contact memory cell has an access transistor, the access transistor is switched off to decouple the cell from the bit line after a predetermined amount of time. The predetermined amount of time is sufficiently long enough to permit the logical state of the cell to be transferred to the bit line and also sufficiently short to isolate the cell from the bit line before the sense amplifier operates. For programmable contact memory cells which do not utilize an access transistor, an isolation transistor may be placed in the bit line located between and serially connection the portion of the bit line from the sense amplifier to the isolation transistor and the portion of the bit line from the isolation transistor to the memory cell. The isolation transistor, normally conducting, is switched off after the predetermined time past the time the bit line begins to discharge through the programmable contact memory cell, thereby isolating the programmable contact memory cell from the sense amplifier before a sensing operation begins.

14 Claims, 10 Drawing Sheets

U.S. PATENT DOCUMENTS

| | | | |
|---|---|---|---|
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,825,046 A | 10/1998 | Czubatyj et al. |
| 5,841,150 A | 11/1998 | Gonzalez et al. |
| 5,846,889 A | 12/1998 | Harbison et al. |
| 5,883,827 A | 3/1999 | Morgan |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,314,014 B1 | 11/2001 | Lowrey et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,429,064 B1 | 8/2002 | Wicker |
| 6,437,383 B1 | 8/2002 | Xu |
| 6,462,981 B1 | 10/2002 | Numata et al. |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Klersy et al. |
| 6,511,862 B1 | 1/2003 | Hudgens et al. |
| 6,511,867 B1 | 1/2003 | Lowrey et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B2 | 4/2003 | Chiang |
| 6,545,907 B1 | 4/2003 | Lowrey et al. |
| 6,555,860 B1 | 4/2003 | Lowrey et al. |
| 6,563,164 B1 | 5/2003 | Lowrey et al. |
| 6,566,700 B1 | 5/2003 | Xu |
| 6,567,293 B1 | 5/2003 | Lowrey et al. |
| 6,569,705 B1 | 5/2003 | Chiang et al. |
| 6,570,784 B1 | 5/2003 | Lowrey |
| 6,576,921 B1 | 6/2003 | Lowrey |
| 6,586,761 B1 | 7/2003 | Lowrey |
| 6,589,714 B1 | 7/2003 | Maimon et al. |
| 6,590,807 B1 | 7/2003 | Lowrey |
| 6,593,176 B1 | 7/2003 | Dennison |
| 6,597,009 B1 | 7/2003 | Wicker |

| | | |
|---|---|---|
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowrey et al. |
| 6,642,102 B1 | 11/2003 | Xu |
| 6,646,297 B1 | 11/2003 | Dennison |
| 6,649,928 B1 | 11/2003 | Dennison |
| 6,667,900 B1 | 12/2003 | Lowrey et al. |
| 6,671,710 B1 | 12/2003 | Ovshinsky et al. |
| 6,673,648 B1 | 1/2004 | Lowrey |
| 6,673,700 B1 | 1/2004 | Dennison et al. |
| 6,674,115 B1 | 1/2004 | Hudgens et al. |
| 6,687,153 B1 | 2/2004 | Lowrey |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Afifi, M.A.; Labib, H.H.; Fouad, S.S.; El–Shazly, A.A., Electrical & thermal conductivity of the amorphous semiconductor $GexSe1-x$, Egypt, J. Phys. 17 (1986) 335–342.

Alekperova, Sh.M.; Gadhieva, G.S., Current–Voltage characteristics of $Ag2Se$ single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound $Ag7GeSe5I$: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures $M-Ag2Se-M$, Thin solid films 70 (1980) L1–L4.

Bernede, J.C., Polarized memory switching in MIS thin films, Thin Solid Films 81 (1981) 155–160.

Bernede, J.C., Switching and silver movements in $Ag2Se$ thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in $Ag2Se/Se/M$ thin film sandwiches, Thin solid films 97 (1982) 165–171.

Bernede, J.C.; Khelil, A.; Kettaf, M.; Conan, A., Transition from S– to N–type differential negative resistance in $Al-Al2O3-Ag2-xSe1+x$ thin film structures, Phys. Stat. Sol. (a) 74 (1982) 217–224.

Bondarev, V.N.; Pikhitsa, P.V., A dendrite model of current instability in $RbAg4I5$, Solid State Ionics 70/71 (1994) 72–76.

Boolchand, P., The maximum in glass transition temperature (Tg) near $x=1/3$ in $GexSe1-x$ Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweller, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J. Molecular Structure of Melt–Quenched GeSe2 and GeS2 glasses compared, Proc. Int. Conf. Phys. Semicond. (Eds. Chadi and Harrison) 17$^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193—C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chemyak, L.; Gartsman, K.; Jakubowicz, A., Room–Temperature, electric field induced creation of stable devices in CuInSe2 Crystals, Science 258 (1992 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors with form, Search 1 (1970) 152–155.

Deamaley, G.; Stoneham, A.M.; Morgan, D.V., Electrical phenomena in amorpous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system—Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorhpous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical thermal and optical properties of Se75Ge7Sb18, Vacuum 43 (1992) 253–257.

Feng, X.; Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of Network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.-P.; Rouxel, T.; Keryvin, V.; Sangleboeuf, J.-C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.-P.; Rouxel, T.; Sangleboeuf, J.-C; Melscoet, I.; Lucas, J., Hardness, toughness, and scratchability of germanium–selenium chalcogenide glasses, J. Am. Ceram. Soc. 85 (2002) 1545–52.

Gupta, Y.P., On Electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x <=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185—C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.; Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Shuocker, D.; Rieder, G., On the reliability of amorphous chalcogenide switching devices, J. Non–Cryst. Solids 29 (1978) 397–407.

Sharma, A.K.; Sing, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/ a–Si:H/metal memory devices, J. Non–Cryst. Solids 137–138 (1991) 1257–1262.

Snell, A.J.: Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizimma, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

PCT Written Opinion dated Aug. 20, 2003.

Yoji Kawamoto et al., "Ionic Conduction in $As_2S_3$–$Ag_2S$, $GeS_2$–$GeS_2$–GeS–$Ag_2S$ and $P_2S_5$–$Ag_2S$ Glasses," Journal of Non–Crystalline Solids 20 (1976) 393–404.

Axon Technologies Corporation, Technology Description: *Programmable Metalization Cell(PMC)*, pp. 1–6 (Pre–May 2000).

Helbert et al., *Intralevel hybrid resist process with submicron capability*, SPIE vol. 333 Submicron Lithography, pp. 24–29 (1982).

Hilt, Dissertation: *Materials characterization of Silver Chalcogenide Programmable Metalization Cells*, Arizona State University, pp. Title p.–114 (UMI Company, May 1999).

Hirose et al., *High Speed Memory Behavior and Reliability of an Amorphous $As_2S_3$ Film Doped Ag*, Phys. Stat. Sol. (a) 61, pp. 87–90 (1980).

Kawaguchi et al., *Mechanism of photosurface deposition*, 164–166 J. Non–Cryst. Solids, pp. 1231–1234 (1993).

Kozicki et al., Silver incorporation in thin films of selenium rich Ge–Se glasses, International Congress on Glass, vol. 2, Extended Abstracts, Jul. 2001, pp. 8–9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal–Doped Chalcogenides, Electrochemical Society Proceedings, vol. 99–13, 1999, pp. 298–309.

Kozicki et al., Nanoscale effects in devices based on chalcogenide solid solutions, Superlattices and Microstructures, vol. 27, No. 516, 2000, pp. 485–488.

Kozicki et al., Nanoscale phase separation in Ag–Ge–Se glasses, Microelectornic Engineering 63 (2002) pp. 155–159.

McHardy et al., The dissolution of metals in amorphous chalcogenides and the effects of electron and ultraviolet radiation, 20 J. Phys. C.: Solid State Phys., pp. 4055–4075 (1987).

Owen et al., Metal–Chalcogenide Photoresists for High Resolution Lithography and Sub–Micron Structures, Nanostructure Physics and Fabrication, pp. 447–451 (M. Reed ed. 1989).

Shimizu et al., The Photo–Erasable Memory Switching Effect of Ag Photo–Doped Chalcogenide Glasses, 46 B. Chem Soc. Japan, No. 12, pp. 3662–3365 (1973).

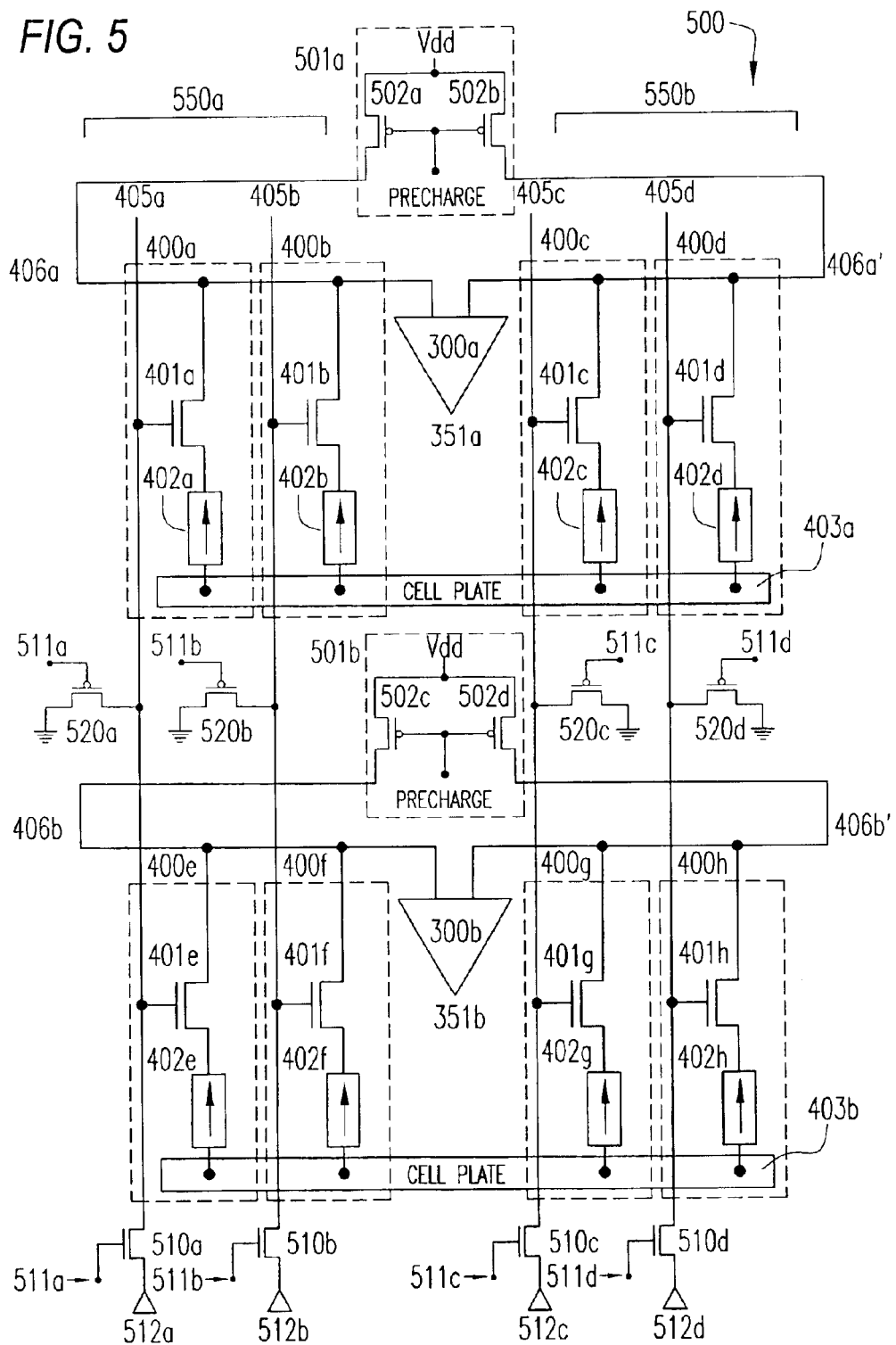

PCRAM REWRITE PREVENTION

This application is a divisional of application Ser. No. 10/035,197, filed Jan. 4, 2002, the subject matter of which is incorporated by reference herein.

FIELD OF INVENTION

The present invention relates to integrated memory circuits. More specifically, it relates to a method for reading a programmable conductor random access memory (PCRAM) cell.

BACKGROUND OF THE INVENTION

Dynamic random access memory (DRAM) integrated circuit arrays have existed for more than thirty years and their dramatic increase in storage capacity has been achieved through advances in semiconductor fabrication technology and circuit design technology. The tremendous advances in these two technologies have also achieved higher levels of integration that permit dramatic reductions in memory array size and cost, as well as increased process yield.

FIG. 1 is a schematic diagram of a DRAM memory cell 100 comprising an access transistor 101 and a capacitor 102. The capacitor 102, which is coupled to a Vcc/2 potential source and the transistor 101, stores one bit of data in the form of a charge. Typically, a charge of one polarity (e.g., a charge corresponding to a potential difference across the capacitor 102 of +Vcc/2) is stored in the capacitor 102 to represent a binary "1" while a charge of the opposite polarity (e.g., a charge corresponding to a potential difference across the capacitor 102 of −Vcc/2) represents a binary "0." The gate of the transistor 101 is coupled to a word line 103, thereby permitting the word line 103 to control whether the capacitor 102 is conductively coupled via the transistor 101 to a bit line 104. The default state of each word line 103 is at ground potential, which causes the transistor 101 to be switched off, thereby electrically isolating capacitor 102.

One of the drawbacks associated with DRAM cells 100 is that the charge on the capacitor 102 may naturally decay over time, even if the capacitor 102 remains electrically isolated. Thus, DRAM cells 100 require periodic refreshing. Additionally, as discussed below, refreshing is also required after a memory cell 100 has been accessed, for example, as part of a read operation.

FIG. 2 illustrates a memory device 200 comprising a plurality of memory arrays 150a, 150b. (Generally, in the drawings, elements having the same numerical value are of the same type. For example, sense amplifiers 300a and 300b in FIG. 2 have identical circuitry to sense amplifier 300 of FIG. 3. A lower case alphabetic suffix is generally used to discriminate between different units of the same type. However, upper case prefixes, such as "N" and "P" may denote different circuitry associated with negative or positive typed variants.) Each memory array 150a, 150b includes a plurality of memory cells 100a–100d, 100e–100h arranged by tiling a plurality of memory cells 100 together so that the memory cells 100 along any given bit line 104a, 104a', 104b, 104b' do not share a common word line 103a–103d. Conversely, the memory cells 100 along any word line 103 do not share a common bit line 104a, 104a', 104b, 104b'. Each memory array has its own set of bit lines. For example, memory array 150a includes bit lines 104a, 104b, while memory array 150b includes bit lines 104a', 104b'. The bit lines from each adjacent pair of memory arrays 150a, 150b are coupled to a common sense amplifier 300a, 300b. For example, bit lines 104a, 104a' are coupled to sense amplifier 300a, while bit lines 104b, 104b' are coupled to sense amplifier 300b. As explained below, the sense amplifiers 300a, 300b are used to conduct the sense/refresh portion when a memory cell 100a–100h is read.

Reading a DRAM memory cell comprises the operations of accessing and sensing/refreshing.

The purpose of the access operation is to transfer charge stored on the capacitor 102 to the bit line 104 associated with the memory cell 100. The access operation begins by precharging each bit line 104a, 104a', 104b, 104b' to a predetermined potential (e.g., Vcc/2) by coupling each bit line 104a, 104b to a potential source (not illustrated). Each bit line 104a, 104b is then electrically disconnected. The bit lines 104a, 104a', 104b, 104b' will float at the predetermined potential due to the inherent capacitance of the bit lines 104a, 104a', 104b, 104b'. Subsequently, the word line (e.g., 103a) associated with a memory cell being read (e.g., 100a) is activated by raising its potential to a level which causes each transistor 101a, 101e coupled to the word line 103a to gate. It should be noted that due to inherent parasitic capacitance between bit lines 104 and word lines 103, activation of a word line 103 will cause the potential at each associated bit line 104 to increase slightly. However, in typical DRAM systems, the magnitude of this potential change is insignificant in comparison to the magnitude of the potential change on the bit lines due to charge sharing. Therefore, with respect to DRAM systems only, further discussion regarding the effect of parasitic capacitance is omitted.

Activation of the word line 103a causes each capacitor 102a, 102e of each memory cell 100a, 100e coupled to that word line 103a to share its charge with its associated bit line 104a, 104b. The bit lines 104a', 104b' in the other array 150b remain at the pre-charge potential. The charge sharing causes the bit line 104a, 104b potential to either increase or decrease, depending upon the charge stored in the capacitors 102a, 102e. Since only the bit lines 104a, 104b of one memory array has its potential altered, at each sense amplifier 300a, 300b, a differential potential develops between the bit lines 104a, 104b associated with the activated word line 103a and the other bit lines 104a', 104b' associated with the same sense amplifier 300a, 300b. Thus, the access operation causes the bit lines 104a, 104b associated with the cell 100a being read to have a potential which is either greater than or less than the pre-charged voltage. However, the change in potential is small and requires amplification before it can be used.

The sense/refresh operation serves two purposes. First, the sense/refresh operation amplifies the small change in potential to the bit line coupled to the cell which was accessed. If the bit line has a potential which is lower than the pre-charge potential, the bit line will be driven to ground during sensing. Alternatively, if the bit line has a potential which is higher than the pre-charge potential, the bit line will be driven to Vcc during sensing. The second purpose of the sense/refresh operation is to restore the state of the charge in the capacitor of the accessed cell to the state it had prior to the access operation. This step is required since the access operation diluted the charge stored on the capacitor by sharing it with the bit line.

FIG. 3 is a detailed illustration of a sense amplifier 300, which comprises a N-sense amp 310N and a P-sense amp portion 310P. The N-sense amp 310N and the P-sense amp 310P include nodes NLAT* and ACT, respectively. These nodes are coupled to controllable potential sources (not illustrated). Node NLAT* is initially biased to the pre-charge potential of the bit lines 104 (e.g., Vcc/2) while node ACT is initially biased to ground. In this initial state, the transistors 301–304 of the N- and P-sense amps 310N, 310P are switched off. The sense/refresh operation is a two phased operation in which the N-sense amp 310N is triggered before the P-sense amp 310P.

The N-sense amp 310N is triggered by bringing the potential at node NLAT* from the pre-charge potential (e.g., Vcc/2) towards ground potential. As the potential difference between node NLAT* and the bit lines 104a, 104a', 104b, 104b' approach the threshold potential of NMOS transistors 301, 302, the transistor with the gate coupled to the higher voltage bit line begins to conduct. This causes the lower voltage bit line to discharge towards the voltage of the NLAT* node. Thus, when node NLAT* reaches ground potential, the lower voltage bit line will also reach ground potential. The other NMOS transistor never conducts since its gate is coupled to the low voltage digit line being discharged towards ground.

The P-sense amp 310P is triggered (after the N-sense amp 310N has been triggered) by bringing the potential at node ACT from ground towards Vcc. As the potential of the lower voltage bit line approaches ground (caused by the earlier triggering of the N-sense amp 310N), the PMOS transistor with its gate coupled to the lower potential bit line will begin to conduct. This causes the initially higher potential bit line to be charged to a potential of Vcc. After both the N- and P-sense amps 310N, 310P have been triggered, the higher voltage bit line has its potential elevated to Vcc while the lower potential bit line has it potential reduced to ground. Thus, the process of triggering both sense amps 310N, 310P amplifies the potential difference created by the access operation to a level suitable for use in digital circuits. In particular, the bit line 104a associated with the memory cell 100a being read is driven from the pre-charge potential of Vcc/2 to ground if the memory cell 100a stored a charge corresponding to a binary 0, or to Vcc if the memory cell 100a stored a charge corresponding to a binary 1, thereby permitting a comparator (or differential amplifier) 350a coupled to bit lines 104a, 104a' to output a binary 0 or 1 consistent with the data stored in the cell 100a on signal line 351. Additionally, the charge initially stored on the capacitor 102a of the accessed cell is restored to its pre-access state.

Efforts continue to identify other forms of memory elements for use in memory cells. Recent studies have focused on resistive materials that can be programmed to exhibit either high or low stable ohmic states. A programmable resistance element of such material could be programmed (set) to a high resistive state to store, for example, a binary "1" data bit or programmed to a low resistive state to store a binary "0" data bit. The stored data bit could then be retrieved by detecting the magnitude of a readout current switched through the resistive memory element by an access device, thus indicating the stable resistance state it had previously been programmed to.

Recently chalcogenide glasses fabricated with solid electrolyte such as a metal doped chalcogenide have been investigated as data storage memory cells for use in memory devices, such as DRAM memory devices. U.S. Pat. Nos. 5,761,115, 5,896,312, 5,914,893, and 6,084,796 all describe this technology and are incorporated herein by reference. The storage cells are called programmable conductor cells (alternatively, they are also known as programmable metallization cells). One characteristic of such a cell is that it typically includes solid metal electrolyte such as a metal doped chalcogenide and a cathode and anode spaced apart on a surface of the fast ion conductor. Application of a voltage across the cathode and anode causes growth of a metal dendrite which changes the resistance and capacitance of the cell which can then be used to store data.

One particularly promising programmable, bi-stable resistive material is an alloy system including Ge:Se:Ag. A memory element comprised of a chalcogenide material has a natural stable high resistive state but can be programmed to a low resistance state by passing a current pulse from a voltage of suitable polarity through the cell. This causes a programmable conductor, also known as a dendrite, to grow between the anode and cathode which lowers the cell resistance. A chalcogenide memory element is simply written over by the appropriate current pulse and voltage polarity (reverse of that which writes the cell to a low resistance state) to reprogram it, and thus does not need to be erased. Moreover, a memory element of chalcogenide material is nearly nonvolatile, in that it need only be rarely (e.g., once per week) connected to a power supply or refreshed, in order to retain its programmed low resistance state. Such memory cells, unlike DRAM cells, can be accessed without requiring a refresh.

While conventional sense amp circuitry, such as those associated with DRAM cells, are capable of sensing programmable conductor random access memory (PCRAM) cells, the natural refresh operation associated with these sense amplifiers are not required in a PCRAM context. Indeed, frequent rewriting of PCRAM cells is not desirable because it can cause the PCRAM cell to become resistant to rewriting. Accordingly, there is a need and desire for a circuit and method for reading PCRAM cells without refreshing them.

SUMMARY OF THE INVENTION

The present invention is directed to a method and apparatus for reading a PCRAM memory cell without refreshing the cell. At a predetermined time after the programmable conductor of the PCRAM cell has been coupled to its bit line, the programmable conductor is electrically decoupled from the bit line. The predetermined time is chosen to be a point in time before the N- and P-sense amplifiers have been activated. In this manner, the N- and P-sense amplifier can change the potential on the bit line without causing the altered potential to rewrite the PCRAM cell. In PCRAM arrays which use access transistors having gates coupled to word lines, the present invention may be practiced by deactivating the word line at the predetermined time after the word line has been activated. In PCRAM arrays which do not include access transistors, isolation transistors may be added on each bit line between the PCRAM cell and the sense amplifier to decouple the PCRAM cells from their associated bit lines.

BRIEF DESCRIPTION OF THE DRAWINGS

The foregoing and other advantages and features of the invention will become more apparent from the detailed description of exemplary embodiments of the invention given below with reference to the accompanying drawings in which:

FIG. 5 is a schematic diagram a PCRAM array;

DETAILED DESCRIPTION OF THE INVENTION

Figure 1:
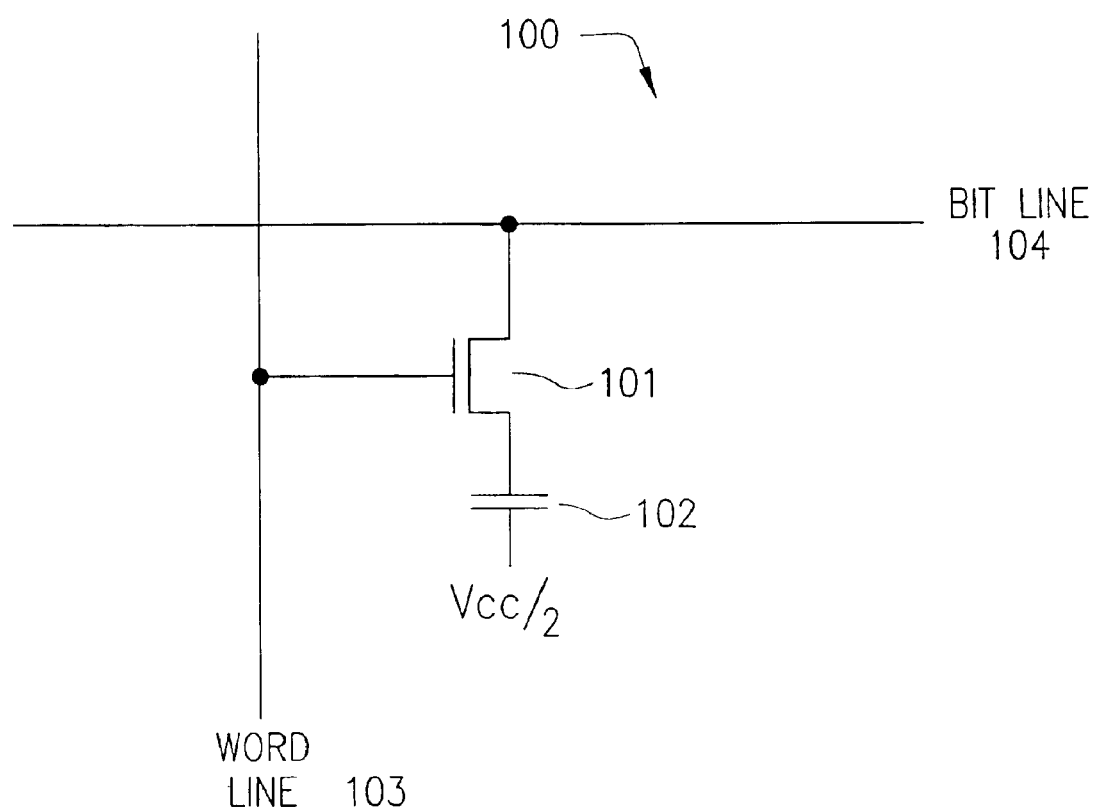
FIG. 1 is a schematic diagram of a conventional DRAM cell.
Figure 2:
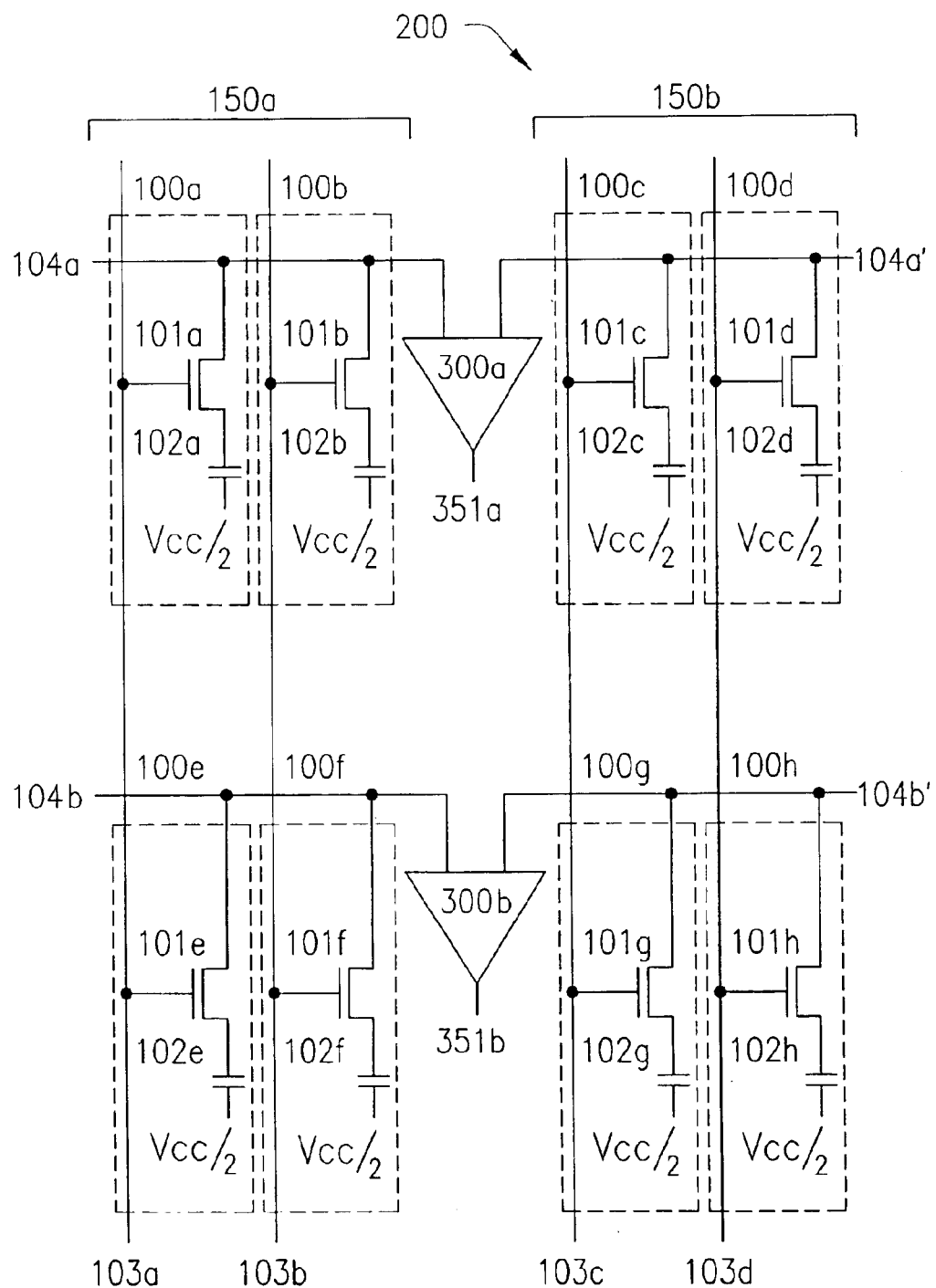
FIG. 2 is a schematic diagram of a conventional DRAM array.
Figure 3:
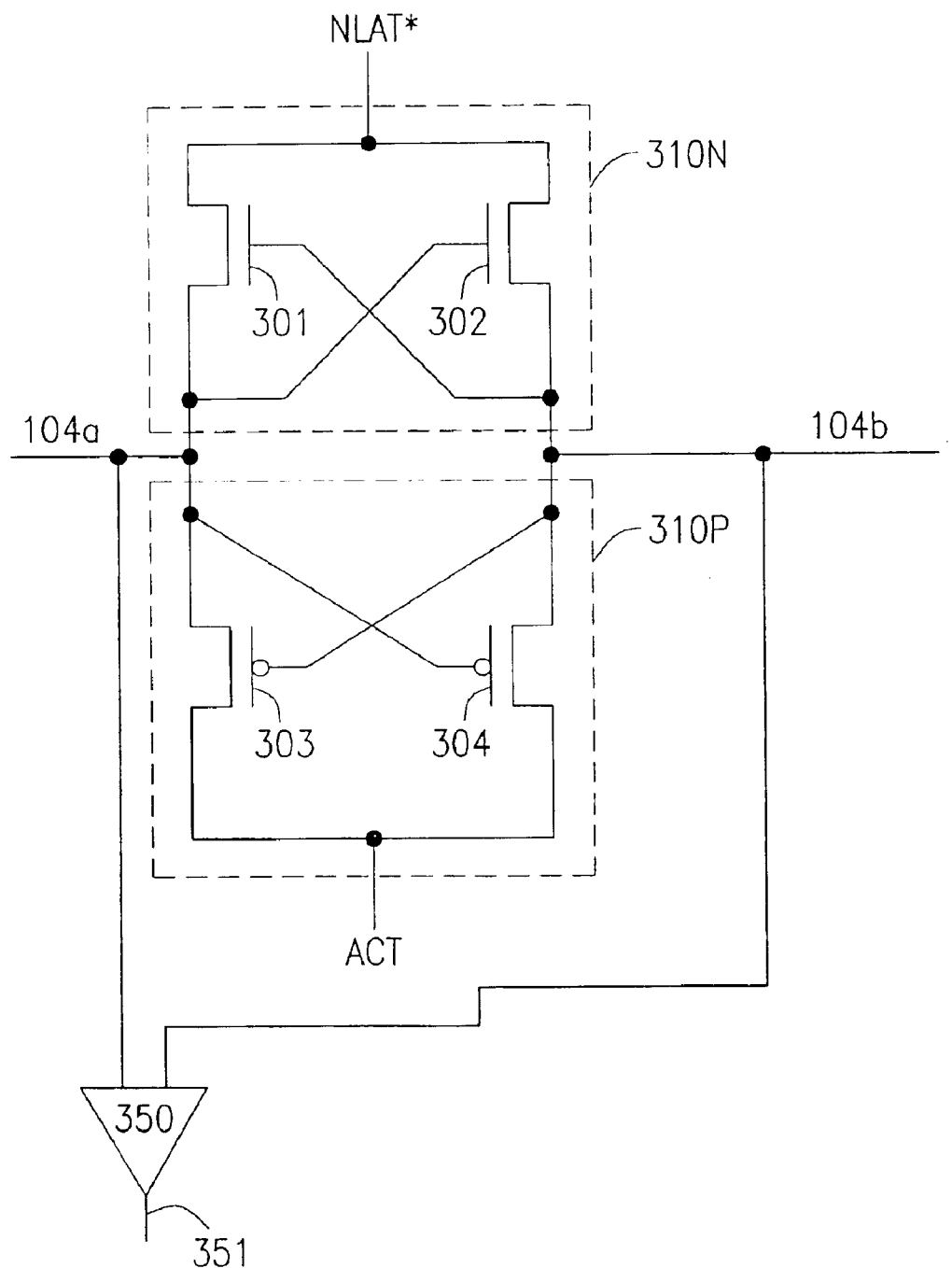
FIG. 3 is schematic diagram a conventional sense amplifier.
Figure 4:
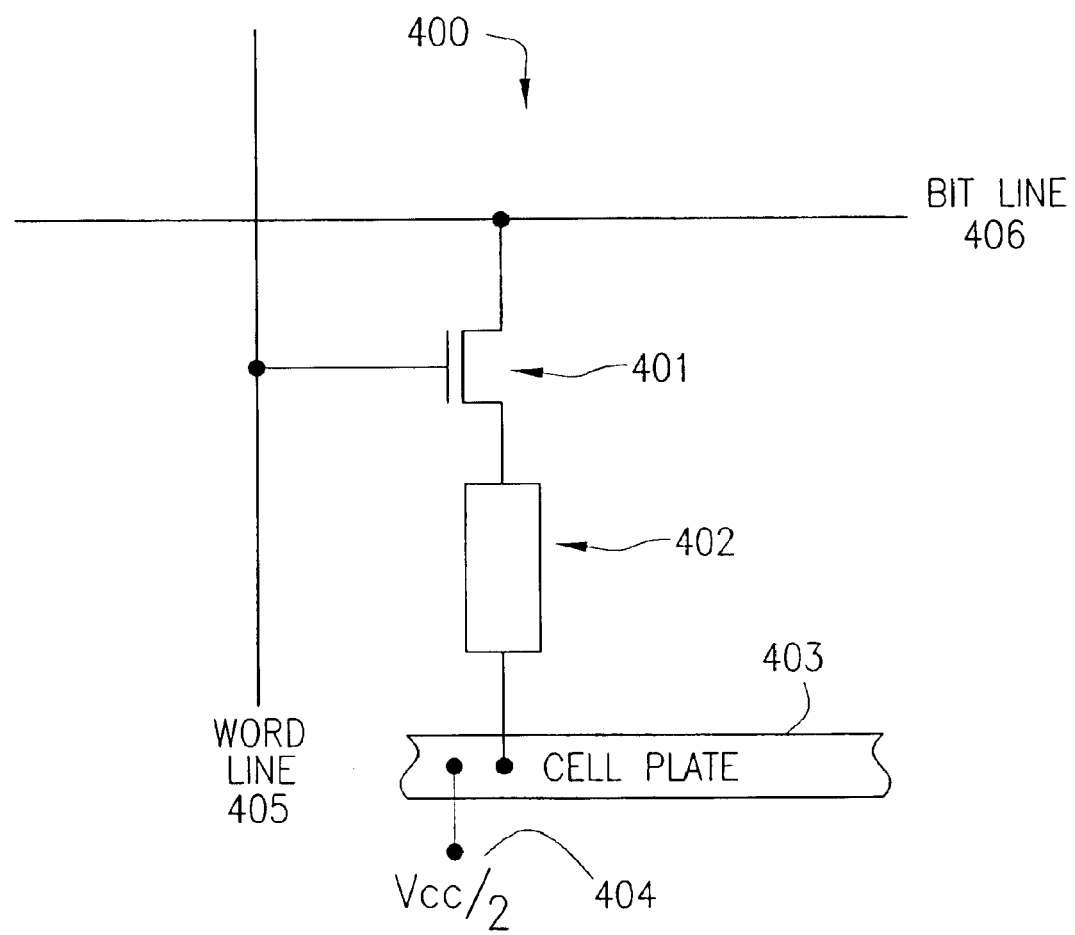
FIG. 4 is a schematic diagram of a PCRAM cell.

Now referring to the drawings, where like reference numerals designate like elements, there is shown in FIG. 4 a PCRAM cell 400 and in FIG. 5 a memory device 500 a memory device comprised of a plurality of PCRAM cells 400a–400h. As illustrated in FIG. 4, a PCRAM cell 400 comprises an access transistor 401, a programmable conductor memory element 402, and a cell plate 403. The access transistor 401 has its gate coupled to a word line 405 and one terminal coupled to a bit line 406. A small portion of an array of such cells is shown in FIG. 5 as including bit lines 406a, 406a', 406b, 406b', and word lines 405a, 405b, 405c, and 405d. As shown in FIG. 5, the bit lines 406a, 406b are coupled to a respective pre-charge circuits 501a, 105b, which can switchably supply a pre-charge potential to the bit lines 406a, 406a', 406b, 406b'. The other terminal of the access transistor 401 is coupled to one end of the programmable conductor memory element 402, while the other end of the programmable conductor memory element 402 is coupled to a cell plate 403. The cell plate 403 may span and be coupled to several other PCRAM cells. The cell plating 403 is also coupled to a potential source. In the exemplary embodiment the potential source is at 1.25 volts (Vdd/2).

The access transistor 401, as well as the other access transistors, are depicted as N-type CMOS transistors, however, it should be understood that P-type CMOS transistors may be used as long as the corresponding polarities of the other components and voltages are modified accordingly. The programmable conductor memory element 402 is preferably made of chalcogenide, however, it should be understood that any other bi-stable resistive material known to those with ordinary skill in the art may also be used. In the exemplary embodiment, the programmable conductor memory element 402 stores a binary 0 when has a resistance of approximately 10 K ohm, and a binary 1 when it has a resistance greater than 10 M ohm. The programmable conductor is ideally programmed to store a low resistance, e.g., binary 0, by a voltage of +0.25 volt and can be restored to a high resistance value, e.g., a binary 1, by a programming voltage of −0.25 volt. The programmable conductor can be nondestructively read by a reading voltage having a magnitude of less than 0.25 volt. In the exemplary embodiment, the reading voltage is 0.2 volt. However, it should be readily apparent that alternate parameters may be selected for the PCRAM cell without departing from the spirit and scope of the invention.

FIG. 5 illustrates a memory device 500 comprising a plurality of memory arrays 550a, 550b. Each memory array 550a, 550b includes a plurality of memory cells 400a–400d, 400e–400h arranged by tiling a plurality of memory cells 400 together so that the memory cells 400 along any given bit line 406a, 406a', 406b, 406b' do not share a common word line 405a–405d. Conversely, the memory cells 400 along any word line 405a–405d do not share a common bit line 406a, 406a', 406b, 406b'. Each word line is switchably to a word line driver 512a–512d via a transistor 510a–510d. Additionally, each word line may also be switchably coupled to ground via transistors 520a–520d. The gates of the transistors 510a–510d, 520a–520d are coupled to signal lines 511a–511d used to selectively couple/decouple the word lines 405a–405d to/from the word line drivers 512a–512b/ground. Each memory array 550a, 550b has its own set of bit lines. For example, memory array 550a includes bit lines 406a, 406b, while memory array 550b includes bit lines 406a', 406b'. The bit lines from each adjacent pair of memory arrays 550a, 550b are coupled to a common sense amplifier 600a, 600b. For example, bit lines 406a, 406a' are coupled to sense amplifier 600a, while bit lines 406b, 406b' are coupled to sense amplifier 600b. For simplicity, FIG. 5 illustrates a memory device having only two arrays 550a, 550b, and eight cells 400a–400h. However, it should be understood that real world memory devices would have significantly more cells and arrays. For example, a real world memory device may include several million cells 400.

The memory device 500 also includes a plurality of pre-charge circuits 501a–501b. One pre-charge circuit (e.g., 501a) is provided for each pair of bit lines coupled to a sense amplifier (e.g., 406a, 406a'). Each pre-charge circuit (e.g., 501a) includes two transistors (e.g., 501a, 501b). One terminal of each transistor is coupled to a potential source. In the exemplary embodiment, the potential source is at 2.5 volts (Vdd). Another terminal of each transistor (e.g., 502a, 502b) is coupled to its corresponding bit line (e.g., 406a, 406a', respectively). The gate of the each transistor (e.g., 502a, 502b) is coupled to a pre-charge control signal. As illustrated, the transistors (e.g., 502a, 502b) are P-MOS type transistor. Thus, when the pre-charge signal is low, the transistors (e.g., 502a, 502b) conducts, thereby pre-charging the bit lines (e.g., 406a, 406a'). When the pre-charge signal is high, the transistors (e.g., 502a, 502b) are switched off. Due to capacitance inherent in the bit lines (e.g., 406a, 406a'), the bit lines will remain at approximately the pre-charge voltage level of 2.5 volts for a predetermined period of time.

Reading a PCRAM cell, for example, cell 400a, in the PCRAM device 500 comprises the operations of accessing and sensing.

Figure 7:
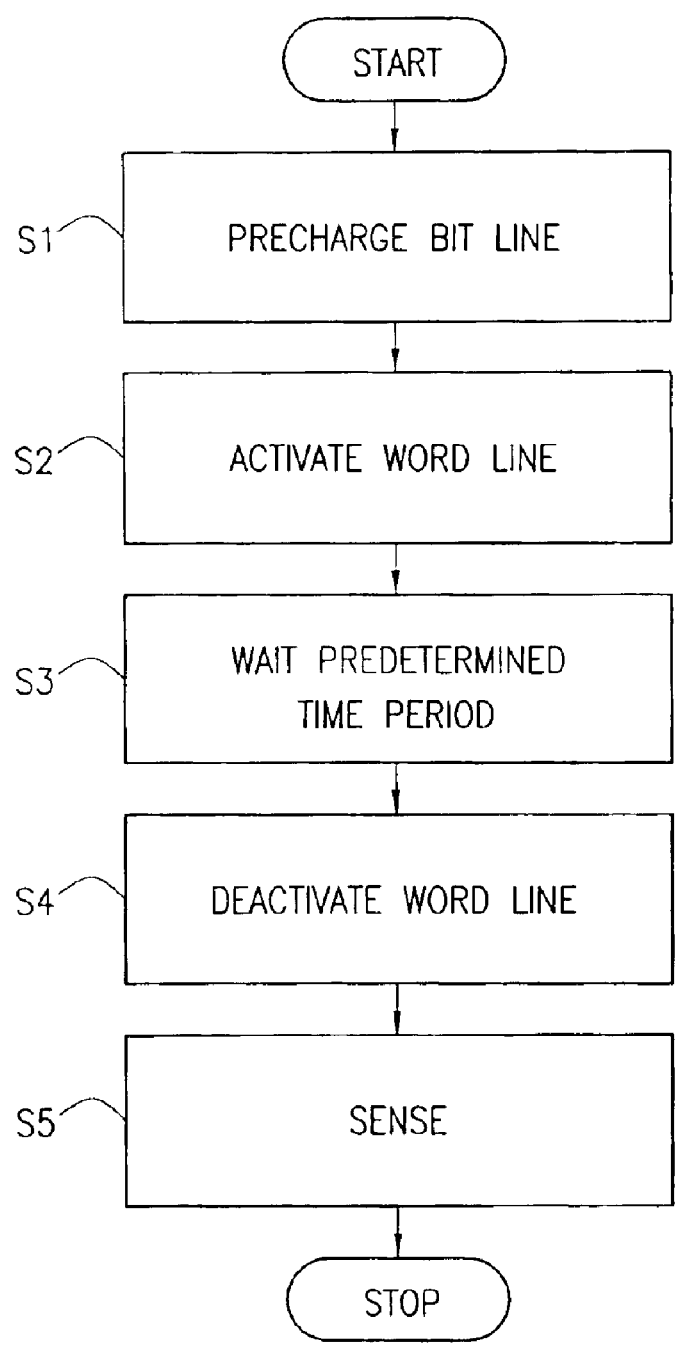
FIG. 7 is a flow chart illustrating the method of the invention.

The purpose of the access operation is to create a small potential difference between the bit lines (e.g., 406a, 406a') coupled to the same sense amplifier (e.g., 300a) of the memory cell 400a being read. This small potential difference can be subsequently amplified by a sense amplifier 300 to the threshold required to subsequently drive a comparator coupled to the bit lines to output a value corresponding to the contents of the memory cell 400a. Now also referring to FIG. 7, the access operation begins with the pre-charging of the bit lines 406a, 406a', 406b, 406b' of the memory device 500 via pre-charge circuits 501a–501b (step S1). The bit lines may be pre-charged by temporarily bringing the pre-charge signal low, causing transistors 502a–502d to conduct the pre-charge voltage (Vdd) to the bit lines 406a, 406a', 406b, 406b'. Once the pre-charge signal returns to a high state, the transistors 502a–502d stop conducting, but the bit lines 406a, 406a', 406b, 406b' will remain at the pre-charge potential for a predetermined period due to the capacitance inherent in the bit lines.

In the exemplary embodiment, bit lines 406a, 406a', 406b, 406b' are pre-charged to 2.5 volts and the cell plate 403a, 403b is tied to 1.25 volts. The 1.25 volt potential difference between the bit line and the cell plate will cause the bit line to discharge to the cell plate through the access transistor 401 (when it is in a conductive state) and the programmable conductor memory element 402. The discharge rate is dependent upon the resistive state of the programmable conductor memory element 402. That is, a low resistive state will cause the bit line to discharge faster than a high resistive state. As the bit line discharges, its voltage will fall from the pre-charge voltage toward the cell plate voltage.

In the memory device 500, the word lines 405a–405d are normally at ground potential. Thus the access transistors 401a–401e are normally switched off. Now also referring to FIGS. 6A and 6B, at time T1, the word line 405a associated with the cell 400a to be read is activated by bringing its potential from ground to a predetermined level (step S2). The predetermined level is designed to create a reading voltage at the programmable contact 402a, which as previously explained, must have a magnitude less than the magnitude of a writing voltage. In the exemplary embodiment, the word line 401a is brought to 2.25 volt. Since the threshold voltage of the transistor 401a is 0.8 volt, the potential at the interface between the transistor 401a and the programmable contact 402a is 1.45 volt. This results in a reading voltage of 0.2 volt since the voltage at the interface between the programmable contact 402a and the cell plate 403a is maintained at 1.25 volt.

Due to the inherent parasitic capacitance between the word line 401a and its associated bit lines 406a the potential in the associated bit line 406a increase as the word line 401a is activated. In the exemplary embodiment, the potential in bit line 406a increases by 0.1 volt to 2.6 volt. It should be noted that the word lines 405c, 405d coupled to complementary bit lines 406a', 406b' remain at ground potential. Thus, bit lines 406a', 406b' remain at the pre-charge potential, which is 2.5 volt in the exemplary embodiment.

The increased potential of bit line 406a is used in combination with the two bi-stable resistive states of the programmable contact 402a to cause one of the bit lines (e.g., 406a) coupled to a sense amplifier (e.g., 300a) to have either a greater or lesser voltage than the other bit line (e.g., 406a') coupled to the same sense amplifier 300a. Essentially, the parasitic capacitance between word lines and associated bit lines is used to achieve an initial state where the bit line (e.g., 406a) associated with the cell 400a being read is at a higher potential than the other bit line 406a' coupled to the same sense amplifier 300a. The memory is designed and operated so that if the programmable contact 402a has a high resistive state, bit line 406a discharges slowly, thereby causing it to maintain its relatively higher potential. However, if the programmable contact 402a has a low resistive state, bit line 406a discharges at a faster rate, so that bit line 406 transitions to a lower potential state than bit line 406a'. These two effects can be seen by comparing FIG. 6A (illustrating the effects of a programmable contact at a high resistive state) and FIG. 6B (illustrating the effects of a programmable contact at a low resistive state.)

At time T2, a predetermined time t after time T1 (step S3), the word line 405a associated with the cell 400a being read is deactivated by returning its potential to ground (step S4). Word line deactivation may be achieved by, for example, grounding terminal 511a, which will cause the transistor 510a serially coupling the word line driver 512a to the word line 405a to stop conducting. This shuts off access transistors 401a, 401 thereby preventing further discharge of the bit line through the programmable contact 402a, 402e. This also prevents the amplified potential difference developed during the subsequent sensing operation from refreshing (writing) the programmable contact 402a, 402e. In the rare instance when it would be desirable to refresh the contents of the programmable contact 402a, 402e, the word line can be held high for a longer period of time. This mode of operation is shown via the dashed trace in FIGS. 6A and 6B. In the exemplary embodiment, the predetermined time t is approximately 15 nanosecond (i.e., T2=T1+15 ns).

Figure 6A:
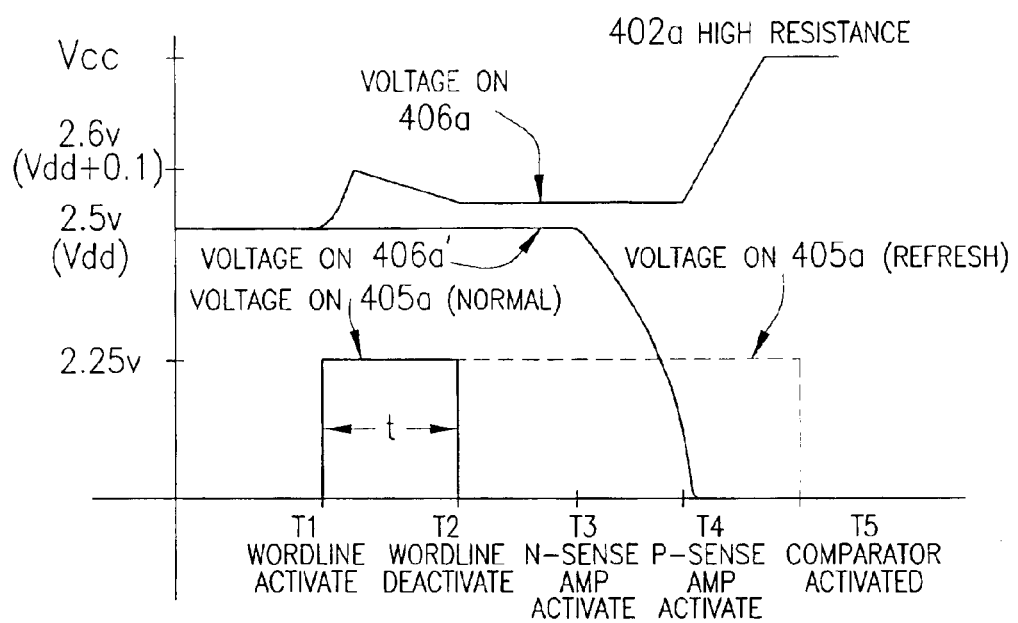
FIGS. 6A and 6B are timing diagrams illustrating the voltages on the word and bit lines when a PCRAM cell is read in high resistance and low resistance states, respectively.
Figure 6B:
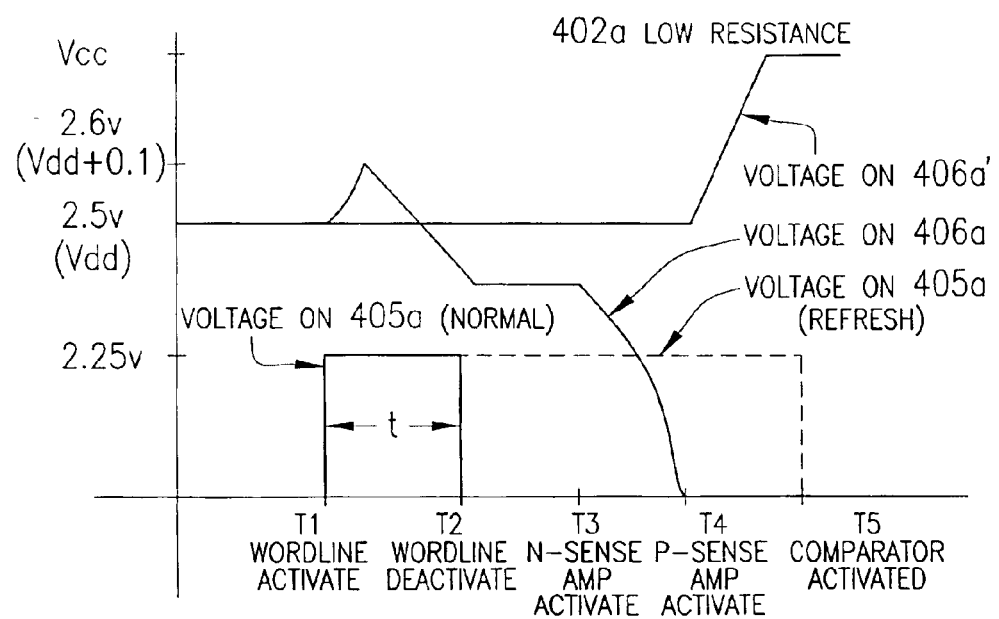

It should be noted that the values of t and T2 may be varied without departing from spirit of the invention. In particular, the objectives of the present invention will be realized by electrically decoupling the programmable contact from the bit line at any time before the bit line voltages are amplified by the sense amplifiers 310N, 310P to a level which would result in the potential difference across the programmable contact reaching threshold required to write the programmable contact. Thus, while FIGS. 6A and 6B illustrate T2 occurring prior to either sense amplifiers 310N, 310P being activated, depending upon the electrical characteristics of the memory device 500, T2 may occur, for example, between the activation of the N-sense amp 310N and the P-sense amp 310P. Regardless, the predetermined time t must be sufficiently long to permit the logical state of the programmable conductor 402a to be reflected on the bit line 406a; i.e., the bit line 406a voltage to be sufficiently altered from the pre-charge voltage by the discharge through the programmable conductor 402a so that the two resistive states of the programmable conductor 402a can be distinguished and amplified by the sense amplifier 300a.

At time period T3, the N-sense amplifier 310N is activated (start of step S5). As previously noted with respect to DRAM systems, activating the N-sense amplifier causes the bit line (e.g., 406a') having the lower potential to be pulled with the NLAT signal toward ground. In the exemplary embodiment, T3 is approximately 30 nanosecond after T1. However, it should be noted that the value T3 may be varied without departing from spirit of the invention.

At time period T4, the P-sense amplifier 310P is activated. As previously noted with respect to DRAM systems, activating the P-sense amplifier causes the bit line (e.g., 406a) having the higher potential to be pulled towards Vcc. In the exemplary embodiment, T4 is approximately 35 nanosecond after T1 (end of step S5). However, it should be noted that the value of T4 may be varied without departing from spirit of the invention.

At time T5, the sense amplifier 300a associated with the cell 400a being read will have one of its bit lines (e.g., 406a) at Vcc potential and the other bit line (e.g., 406a') at ground potential. Since one bit line coupled to sense amplifier 300a is now at ground potential while the other bit line is now at Vcc potential, a comparator (or differential amplifier) 350 can be used to output a value corresponding to the contents of the cell 400a on signal line 351a.

Figure 9:
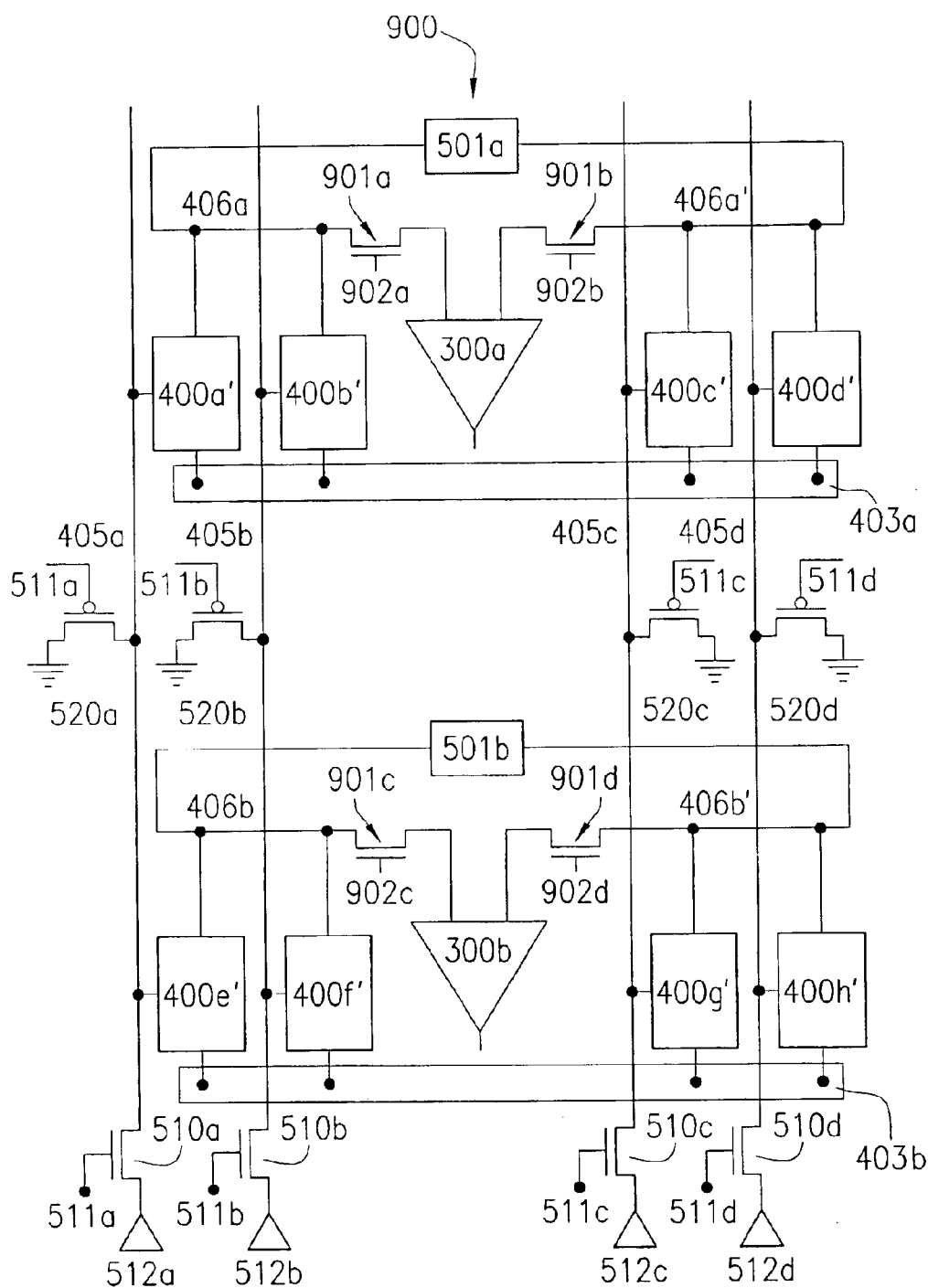
FIG. 9 is a schematic diagram of a PCRAM array according to a second embodiment of the present invention.
Figure 10:
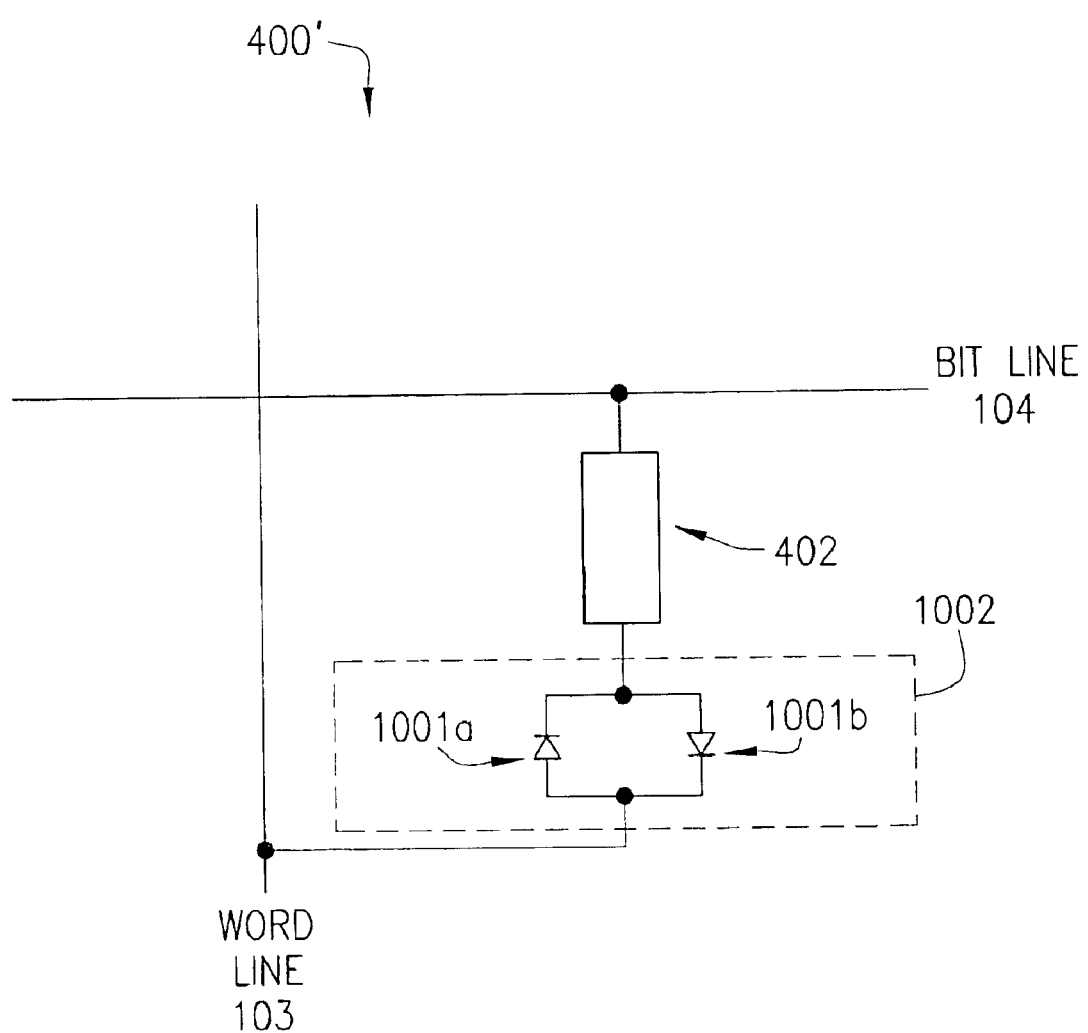
FIG. 10 is a schematic diagram of an alternative embodiment of a PCRAM cell for use with the PCRAM array of FIG. 9.

FIG. 9 is an illustration of a memory device 900 according to an alternate embodiment of the present invention. This alternate embodiment is designed for use with PCRAM cells which do not include an access transistor 401. For example, FIG. 10 illustrates one example of a PCRAM cell 400' which utilizes a pair of diodes 1001a, 1001b in lieu of an access transistor. As illustrated, the PCRAM cell 400' features a programmable conductor memory element 402 which is coupled to a bit line 104. The programmable conductor memory element 402 is also coupled to the word line via a diode circuit 1002. The diode circuit comprises two diodes 1001a, 1001b arranged as shown.

The memory device 900 is otherwise very similar to the memory device 500 of the first embodiment. However, memory device 900 includes new isolation transistors 901a–901d which serially connect the sense amplifiers 300a, 300d to the bit lines 406a, 406a', 406b, 406b'. The invention operates in memory device 900 in a manner very similar to memory device 500 except that instead of deactivating word lines 405a to electrically decouple memory cell 400a from amplified voltages on the bit line 406a' prior to sensing, the isolation transistor 901a, which is normally conducting, is turned off, thereby bifurcating the bit line 406a. The portion of the bit line between the transistor 901a and the sense amplifier 301a will then be sensed while the portion of the bit line between the transistor 901a and the pre-charge circuit 501a will be isolated from the sense amplifier.

Figure 8:
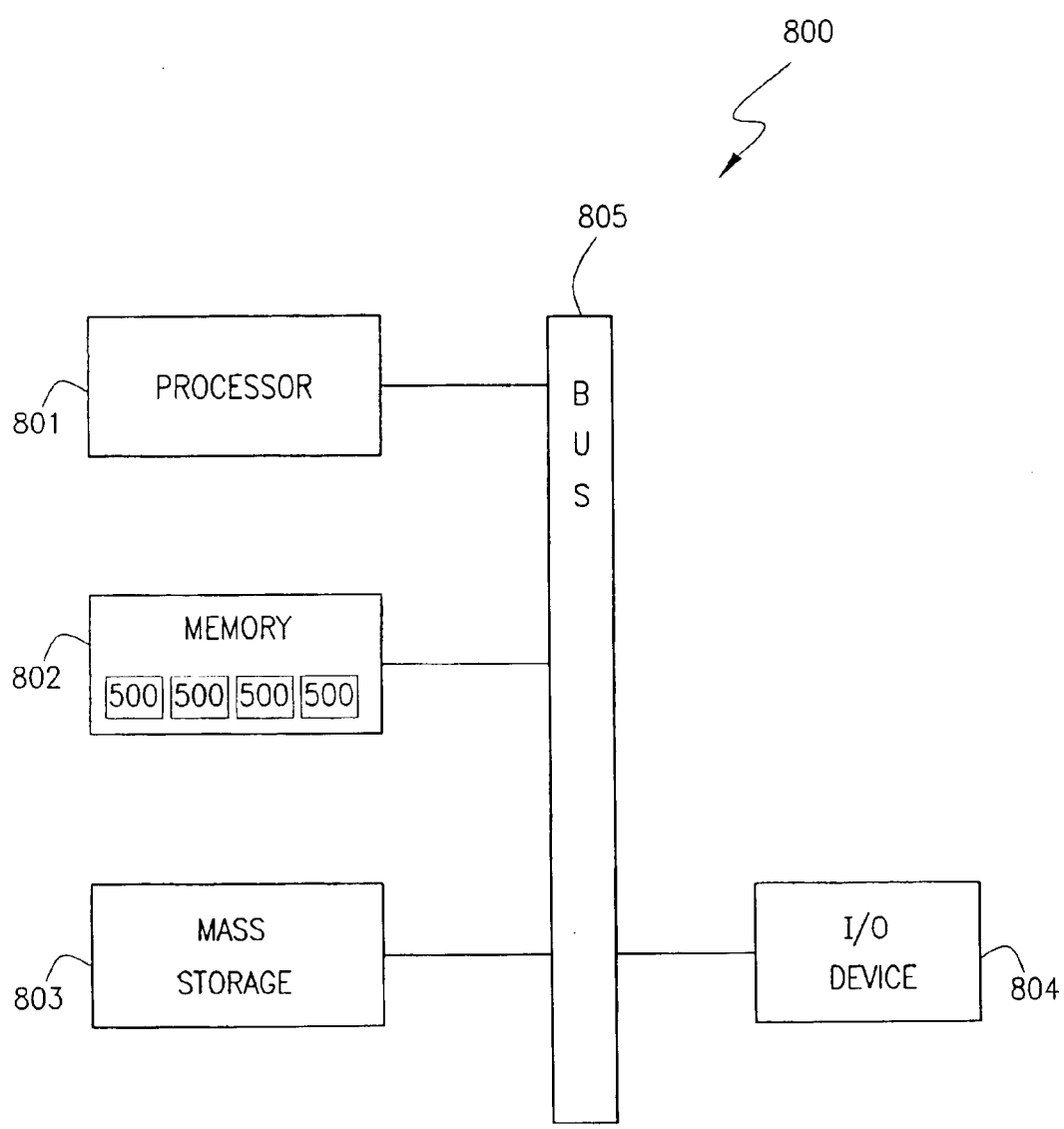
FIG. 8 is a block diagram of a processor based system including a PCRAM in accordance with the principles of the present invention.

FIG. 8 is a block diagram of a processor based system 800, such as a computer system, containing a PCRAM semiconductor memory 802 as described in connection with the other figures. The memory 802 may be constituted as one or more memory chips or memory integrated circuits mounted on a memory module, for example, a plug-in memory module such as a SIMM, DIMM, or other plug-in memory module. The processor based system 800 includes a processor 801, a memory 802, a mass storage 803, and an I/O device 804, each coupled to a bus 805. While a single processor 801 is illustrated, it should be understood that processor 801 could be any type of processor and may include multiple processor and/or processors and co-processors. Memory 802 is illustrated in FIG. 9 as having a plurality of PCRAM chips 500. However, memory 802 may only include a single PCRAM device 500, or a larger plurality of PCRAM devices 500 than illustrated, and/or may include additional forms of memories, such as non-volatile memory or cache memories. While one mass storage 803 device is illustrated, the processor based system 800 may include a plurality of mass storage devices, possibly of varying types such as, but not limited to, floppy disks, CDROMs, CD-R, CD-RW, DVD, hard disks, and disk arrays. I/O device 804 may likewise comprise a plurality of I/O devices of varying types, including, but not limited to keyboard, mouse, graphic cards, monitors, and network interfaces. Bus 805, while illustrated as a single bus may comprise a plurality of buses and/or bridges, which may be coupled to each other or bridged by other components. Some of the devices 801–804 may be coupled to only a single bus 805, others may be coupled to a plurality of buses 805.

The present invention provides a PCRAM cell 400 and a method for reading the contents of the cell 400 using sense amplifiers but without rewriting the contents of the cell. Rewrite prevention is achieved by isolating the programmable conductor 402 of the cell 400 from the bit line 406 a predetermined amount of time after the programmable conductor 402 has been electrically coupled to the bit line 406. The predetermined amount of time corresponds a time prior to the activation time of both the N- and P-sense amps 310N, 310P. In the exemplary embodiment, the PCRAM cell 400 includes an access transistor 401 for electrically coupling and decoupling the cell to the bit line. The access transistor 401 has a gate coupled to a word line. Thus, in the exemplary embodiment, the word line is deactivated the predetermined amount of time after it has been activated, thereby ensuring that the activation of the N- and P-sense amplifiers 310N, 310P do not rewrite the cell 400. In another embodiment, the PCRAM cell 400 does not include an access transistor. For example, the PCRAM cell instead utilize diodes. In any embodiment without an access transistor, isolation transistor may be inserted between the programmable contact memory element and the bit line associated with the programmable contact memory element. The isolation transistors, which are normally conducting, may be switched off at the same predetermined time as in the exemplary embodiment, after the word line has been activated, thereby achieving the same result of isolating the programmable contact memory element from the elevated voltages generated during sensing.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A method for reading data from a programmable conductor random access memory cell, said method comprising:
    activating an addressed word line containing said programmable conductor random access memory cell and transferring a logical value in said cell to an associated addressed bit line;
    deactivating said addressed word line; and
    sensing a logical value transferred to said bit line after said word line is deactivated.

2. The method of claim 1, wherein said deactivating takes place a predetermined amount of time after said activating.

3. The method of claim 1, wherein said sensing further comprises,
    activating a first sense amplifier unit; and
    activating a second sense amplifier unit a second predetermined time after said activating of said first sense amplifier unit.

4. The method of claim 1, wherein said deactivating takes place a first predetermined amount of time after said activating of an addressed word line.

5. The method of claim 4, wherein said first predetermined amount of time is after said activating of said first sense amplifier unit and before said activating of said second sense amplifier unit.

6. The method of claim 4, wherein said first predetermined amount of time is before said activating of said first sense amplifier unit and before said activating of said second sense amplifier unit.

7. A method for reading data from a programmable conductor random access memory cell, said method comprising:
    activating an addressed word line containing said programmable conductor random access memory cell and transferring a logical value in said cell to an associated addressed bit line;
    switching off an isolation transistor located on the associated addressed bit line and serially connecting a sense amplifier and said cell;
    sensing a logical value transferred to said bit line after said word line is deactivated.

8. The method of claim 7, wherein said switching off takes place a predetermined amount of time after said activating.

9. The method of claim 7, wherein said sensing further comprises,
    activating a first sense amplifier unit; and activating a second sense amplifier unit a second predetermined time after said activating of said first sense amplifier unit.

10. The method of claim 8, wherein said switching off takes place a first predetermined amount of time after said activating of an addressed word line.

11. The method of claim 10, wherein said first predetermined amount of time is after said activating of said first sense amplifier unit and before said activating of said second sense amplifier unit.

12. The method of claim 10, wherein said first predetermined amount of time is before said activating of said first sense amplifier unit and before said activating of said second sense amplifier unit.

13. A method for reading data from a programmable conductor random access memory cell, said method comprising:

pre-charging a first bit line coupled to the programmable conductor random access memory cell, said memory cell including a programmable conductor memory element;

pre-charging a second bit line;

increasing voltage on said first bit line;

switching on an access transistor of said cell to couple the programmable conductor memory element to said first bit line;

switching off the access transistor of said cell to decoupling the programmable conductor memory element from said first bit line;

sensing voltage on said first bit line and said second bit line to determine a logical state of said programmable conductor memory element;

wherein said switching off is performed before said sensing.

14. A method for reading data from a programmable conductor random access memory cell, said method comprising:

switching on an isolation transistor to couple a first bit line to a sense amplifier, said first bit line also coupled to a programmable conductor memory element of the programmable conductor random access memory cell;

pre-charging said first bit line;

pre-charging a second bit line;

increasing voltage on said first bit line;

switching off said isolation transistor to decouple said programmable conductor memory element from said sense amplifier;

sensing voltage on said first bit line and said second bit line to determine a logical state of said programmable conductor memory element;

wherein said switching off is performed before said sensing.

* * * * *